United States Patent
Li et al.

(10) Patent No.: US 10,599,241 B2
(45) Date of Patent: Mar. 24, 2020

(54) TOUCH PANEL AND METHOD FOR MANUFACTURING THE SAME, DISPLAY APPARATUS

(71) Applicants: BOE Technology Group Co., Ltd., Beijing (CN); Hefei Xinsheng Optoelectronics Technology Co., Ltd., Anhui (CN)

(72) Inventors: Ning Li, Beijing (CN); Jianming Jiang, Beijing (CN); Wei Gu, Beijing (CN); Tengli Wang, Beijing (CN); Daqing Sun, Beijing (CN); Ganlin Ruan, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 118 days.

(21) Appl. No.: 15/745,041

(22) PCT Filed: Jul. 18, 2017

(86) PCT No.: PCT/CN2017/093317
§ 371 (c)(1),
(2) Date: Jan. 15, 2018

(87) PCT Pub. No.: WO2018/076817
PCT Pub. Date: May 3, 2018

(65) Prior Publication Data
US 2019/0012026 A1    Jan. 10, 2019

(30) Foreign Application Priority Data
Oct. 31, 2016   (CN) .......................... 2016 1 0965921

(51) Int. Cl.
*G06F 3/041* (2006.01)
*G06F 3/045* (2006.01)
(Continued)

(52) U.S. Cl.
CPC .......... *G06F 3/0412* (2013.01); *G03F 7/0007* (2013.01); *G06F 3/044* (2013.01);
(Continued)

(58) Field of Classification Search
CPC ....... G06F 3/044; G06F 3/0412; G06F 3/0416
See application file for complete search history.

(56) References Cited

U.S. PATENT DOCUMENTS

2014/0145979 A1    5/2014  Lee
2016/0147325 A1*   5/2016  Tai .......................... G06F 3/041
                                                  345/173
(Continued)

FOREIGN PATENT DOCUMENTS

CN        202472596 U    10/2012
CN        203552211 U     4/2014
(Continued)

OTHER PUBLICATIONS

International Search Report dated Oct. 12, 2017 issued in corresponding International Application No. PCT/CN2017/093317 along with an English translation of the ISR and Written Opinion.
(Continued)

*Primary Examiner* — Nan-Ying Yang
(74) *Attorney, Agent, or Firm* — Nath, Goldberg & Meyer; Joshua B. Goldberg; Stephanie Majkut (57) ABSTRACT

The present disclosure provides a touch panel and a method for manufacturing the same, and a display apparatus. The display panel includes a substrate, a touch electrode provided in a touch region of the substrate, and a plurality of signal transmission lines provided in a non-touch wiring
(Continued)

region of the substrate, the non-touch wiring region of the substrate is located in a bezel of the touch panel, the signal transmission lines are coupled to the touch electrode for transmitting a touch signal, the signal transmission lines in the non-touch wiring region are arranged in at least two layers overlapping with each other, and the signal transmission lines of adjacent layers are insulated from each other.

13 Claims, 9 Drawing Sheets

(51) Int. Cl.
*G06F 3/044* (2006.01)
*G03F 7/00* (2006.01)
*G06F 3/047* (2006.01)

(52) U.S. Cl.
CPC .... *G06F 3/047* (2013.01); *G06F 2203/04103* (2013.01); *G06F 2203/04111* (2013.01)

(56) References Cited

U.S. PATENT DOCUMENTS

2016/0195963 A1* 7/2016 Esaka ................ G06F 3/044
  345/174
2017/0185199 A1 6/2017 Xie et al.

FOREIGN PATENT DOCUMENTS

| CN | 204102102 U | 1/2015 |
| CN | 104635981 A | 5/2015 |
| CN | 204406364 U | 6/2015 |
| CN | 104991688 A | 10/2015 |
| CN | 106527801 A | 3/2017 |
| CN | 206147578 U | 5/2017 |

OTHER PUBLICATIONS

First Office Action dated Nov. 29, 2017 issued in corresponding Chinese Application No. 201610965921.0.

* cited by examiner

TOUCH PANEL AND METHOD FOR MANUFACTURING THE SAME, DISPLAY APPARATUS

CROSS REFERENCE FOR RELATED APPLICATION

This is a National Phase Application filed under 35 U.S.C. 371 as a national stage of PCT/CN2017/093317, filed on Jul. 18, 2017, an application claiming the priority of Chinese patent application No. 201610965921.0 filed on Oct. 31, 2016, the full content of which is incorporated here by reference.

FIELD

The present disclosure relates to the field of display technology, and particularly to a touch panel and a method for manufacturing the same, and a display apparatus.

BACKGROUND

With developing of technology and a demand of market, a touch panel is increasingly developing towards having a narrow bezel.

The touch panel on the present market generally uses a metal lead as a signal transmission line, and the metal lead has a characteristic of opaque. Moreover, touch signal transmission lines in the touch panel on the present market are all laid in a single layer, and in order to ensure stability of signal transmission, the metal lead should have a certain width, resulting in that the touch panel cannot be achieved to have a real narrow bezel.

For example, a touch panel of one glass solution (OGS) on the present market uses a metal lead as a signal transmission line, and the narrowest bezel thereof still should be 2 mm.

SUMMARY

The present disclosure provides a touch panel, including a substrate, a touch electrode provided in a touch region of the substrate, and a plurality of signal transmission lines provided in a non-touch wiring region of the substrate, the non-touch wiring region of the substrate is located in a bezel of the touch panel, the signal transmission lines are coupled to the touch electrode for transmitting a touch signal, the signal transmission lines in the non-touch wiring region are arranged in at least two layers overlapping with each other, and the signal transmission lines of adjacent layers are insulated from each other.

In some implementations, the touch electrode includes a plurality of first electrode strips and a plurality of second electrode strips, the first electrode strips intersect with and are insulated from the second electrode strips, the signal transmission lines are coupled to the first electrode strips and the second electrode strips one to one, a portion of the signal transmission lines are arranged in a first layer in the non-touch wiring region, another portion of the signal transmission lines are arranged in a second layer in the non-touch wiring region, and a first insulation layer is interposed between the signal transmission lines of the first layer and the signal transmission lines of the second layer.

In some implementations, the touch electrode includes a plurality of first electrode strips and a plurality of second electrode strips, the first electrode strips intersect with and are insulated from the second electrode strips, each of the first electrode strips is coupled to two of the signal transmission lines, each of the second electrode strips is coupled to two of the signal transmission lines, the two of the signal transmission lines coupled to each of the first electrode strips are respectively coupled to two ends of each of the first electrode strips, the two of the signal transmission lines coupled to each of the second electrode strips are respectively coupled to two ends of each of the second electrode strips, a portion of the signal transmission lines are arranged in a first layer in the non-touch wiring region, another portion of the signal transmission lines are arranged in a second layer in the non-touch wiring region, and a first insulation layer is interposed between the signal transmission lines of the first layer and the signal transmission lines of the second layer.

In some implementations, half of the signal transmission lines coupled to the first electrode strips and the second electrode strips are arranged in the first layer, and another half of the signal transmission lines coupled to the first electrode strips and the second electrode strips are arranged in the second layer, and orthographic projections of the signal transmission lines of the first layer on the substrate completely overlap with orthographic projections of the signal transmission lines of the second layer on the substrate.

In some implementations, the touch panel includes a black matrix provided in the non-touch wiring region, the signal transmission lines of the second layer are arranged at a side of the signal transmission lines of the first layer distal to the substrate, and the black matrix is arranged at a side of the signal transmission lines of the first layer proximal to the substrate.

In some implementations, each of the first electrode strips includes a plurality of first electrode tabs and a plurality of first connection bars, and is formed by connecting the first electrode tabs via the first connection bars, each of the second electrode strips includes a plurality of second electrode tabs and a plurality of second connection bars, and is formed by connecting the second electrode tabs via the second connection bars, the first electrode strips and the second electrode tabs are provided in a same layer, the second connection bars are provided at a side of the first connection bars distal to the substrate and intersect with the first connection bars, and a second insulation layer is interposed between the first connection bars and the second connection bars.

In some implementations, the touch panel includes a non-touch connection region, the signal transmission lines of the first layer and the signal transmission lines of the second layer further extend to the non-touch connection region to connect to a peripheral circuit board in the non-touch connection region, the signal transmission lines of the first layer and the signal transmission lines of the second layer are provided in a same layer in the non-touch connection region, the black matrix further extends to the non-touch connection region, and an orthographic projection of the black matrix on the substrate covers the non-touch connection region.

In some implementations, the touch panel includes an insulation protection layer provided at a side of the touch electrode and the signal transmission lines distal to the substrate, and an orthographic projection of the insulation protection layer on the substrate covers the touch region and the non-touch wiring region.

The present disclosure further provides a display apparatus including the touch panel described above.

The present disclosure further provides a method for manufacturing the touch panel described above, and the method includes steps of: forming a pattern of the touch electrode in the touch region of the substrate by a patterning process; forming a pattern of at least two layers of signal transmission lines that are overlapped with each other in the non-touch wiring region of the substrate by a patterning process, the signal transmission lines of adjacent layers are insulated from each other, and the signal transmission lines are coupled to the touch electrode for transmitting a touch signal.

In some implementations, the step of forming the pattern of at least two layers of signal transmission lines that are overlapped with each other in the non-touch wiring region of the substrate by the patterning process includes sub-steps: S10, forming a pattern of the signal transmission lines of the first layer in the non-touch wiring region by a single patterning process; S11, after completing the sub-step S10, forming a pattern of the first insulation layer in the non-touch wiring region by a single processing process; S12, after completing the sub-step S11, forming a pattern of the signal transmission lines of the second layer in the non-touch wiring region by a single patterning process.

In some implementations, the method includes: before the sub-step S10, forming a pattern of the black matrix in the non-touch wiring region by a patterning process.

In some implementations, the sub-step S10 includes: forming a pattern of the signal transmission lines of the first layer in the non-touch connection region, and the signal transmission lines of the first layer in the non-touch connection region and the signal transmission lines of the first layer in the non-touch wiring region are formed simultaneously by a single patterning process.

In some implementations, the sub-step S11 includes: forming the first insulation layer on the signal transmission lines of the first layer in the non-touch connection region, rather than on other parts except for the signal transmission lines of the first layer in the non-touch connection region.

In some implementations, the sub-step S12 includes: forming a pattern of the signal transmission lines of the second layer on other parts except for the signal transmission lines of the first layer in the non-touch connection region, and the signal transmission lines of the second layer in the non-touch connection region and the signal transmission lines of the second layer in the non-touch wiring region are formed simultaneously by a single patterning process.

In some implementations, the method includes: after the sub-step S12, removing the first insulation layer on the signal transmission lines of the first layer in the non-touch connection region.

In some implementations, the method includes: before the sub-step S10, forming a pattern of the black matrix in the non-touch connection region, and the black matrix in the non-touch connection region and the black matrix in the non-touch wiring region are formed simultaneously by a single pattern process.

In some implementations, the touch electrode includes a plurality of first electrode strips and a plurality of second electrode strips, each of the first electrode strips includes a plurality of first electrode tabs and a plurality of first connection bars, each of the second electrode strips includes a plurality of second electrode tabs and a plurality of second connection bars, the step of forming the pattern of the touch electrode in the touch region of the substrate by the patterning process includes sub-steps: S20, forming a pattern of the first electrode strips and the second electrode tabs in the touch region by a single patterning process; S21, after completing the sub-step S20, forming a pattern of the second insulation layer in the touch region by a single patterning process; S22, after completing the sub-step S21, forming a pattern of the second connection bars in the touch region by a single patterning process.

In some implementations, the second connection bars and the signal transmission lines of the second layer are formed of a same material simultaneously by a single patterning process.

In some implementations, the touch electrode includes a plurality of first electrode strips and a plurality of second electrode strips, the step of forming the pattern of the touch electrode in the touch region of the substrate by the patterning process includes sub-steps: S20', forming a pattern of the first electrode strips in the touch region by a single patterning process; S21', after completing the sub-step S20', forming a pattern of the second insulation layer in the touch region by a single patterning process; S22', after completing the sub-step S21', forming a pattern of the second electrode strips in the touch region by a single patterning process.

In some implementations, the method includes: after forming the pattern of the touch electrode in the touch region and forming the pattern of at least two layers of signal transmission lines that are overlapped with each other in the non-touch wiring region, forming a pattern of the insulation protection layer by a single patterning process, the orthographic projection of the insulation protection layer on the substrate covers the touch region and the non-touch wiring region.

DETAILED DESCRIPTION OF THE EMBODIMENTS

In order to make a person skilled in the art understand technical solutions of the present application better, the present application will be described in detail below in conjunction with accompanying drawings and embodiments.

First Embodiment

Figure 1:
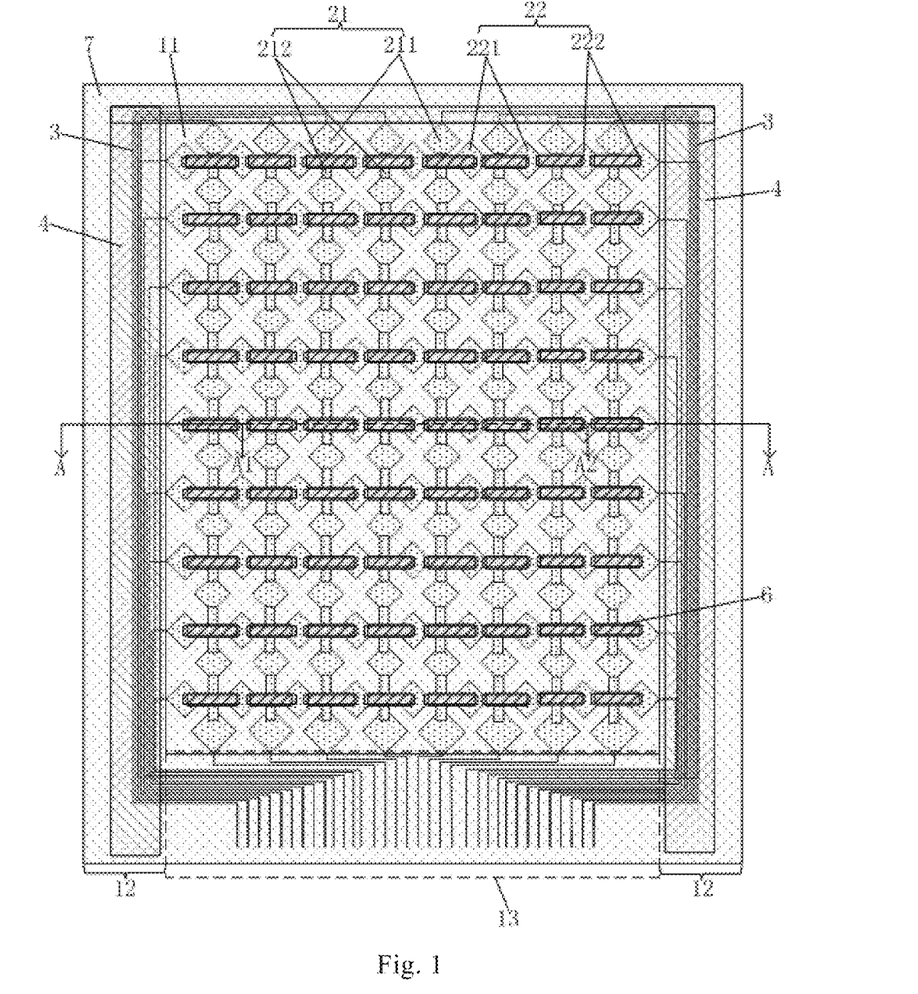
FIG. 1 shows a top view of a structure of a touch panel in accordance with a first embodiment of the present disclosure.
Figure 2:
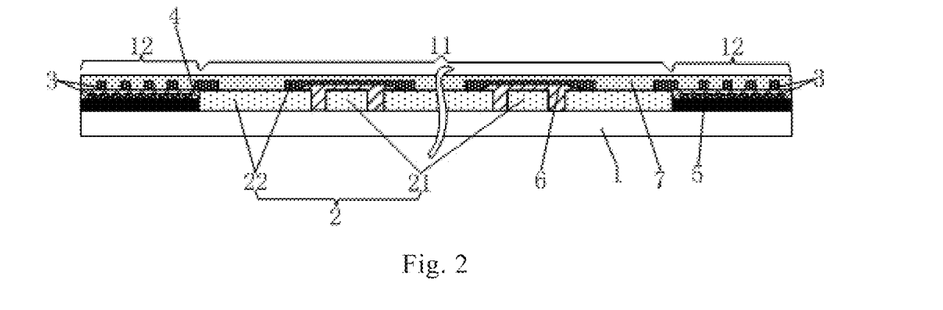
FIG. 2 shows a cross-sectional view of the structure of the touch panel shown in FIG. 1 along a cutting line A-A1-A2-A.

The present embodiment provides a touch panel. As shown in FIGS. 1 and 2, the touch panel includes a substrate 1, a touch electrode 2 provided in a touch region 11 of the substrate 1, and a plurality of signal transmission lines 3 provided in a non-touch wiring region 12 of the substrate 1, the non-touch wiring region 12 of the substrate 1 is located in a bezel of the touch panel, the signal transmission lines 3 are coupled to the touch electrode 2 for transmitting a touch signal, the signal transmission lines 3 in the non-touch wiring region 12 are arranged in at least two layers overlapping with each other, and the signal transmission lines 3 of adjacent layers are insulated from each other.

In the present embodiment, the signal transmission lines 3 being arranged in at least two layers overlapping with each other means that the signal transmission lines 3 are arranged in at least two different layers, and orthographic projections of the signal transmission lines 3 of the at least two different layers on the substrate 1 at least partially overlap with each other, compared with a case where all the signal transmission lines 3 are arranged in a same layer, an area occupied by the signal transmission lines 3 is reduced in a case where the signal transmission lines 3 are arranged in at least two different layers and the orthographic projections of the signal transmission lines 3 of the at least two different layers on the substrate 1 at least partially overlap with each other.

That is to say, in the touch panel of the present embodiment, the area occupied by the signal transmission lines 3 in the non-touch wiring region 12 can be reduced by arranging the signal transmission lines 3 in at least two layers that are overlapped with each other, thus the non-touch wiring region 12 of the touch panel becomes narrower, thereby the touch panel can have a real narrow bezel.

It should be noted that, the non-touch wiring region 12 generally only occupies a part of the bezel of the touch panel, and as shown in FIG. 1, the non-touch wiring region 12 occupies three sides of a bezel of a rectangle touch panel, the area occupied by the signal transmission lines 3 is significantly reduced by arranging the signal transmission lines 3 in at least two layers, thus the three sides of the bezel of the touch panel become narrower, and the signal transmission lines 3 are coupled to a peripheral circuit board at another side of the touch panel.

In the present embodiment, the touch electrode 2 optionally includes a plurality of first electrode strips 21 and a plurality of second electrode strips 22, the first electrode strips 21 intersect with and are insulated from the second electrode strips 22, each of the first electrode strips 21 is coupled to two signal transmission lines 3, each of the second electrode strips 22 is coupled to two signal transmission lines 3, the two signal transmission lines 3 coupled to the first electrode strip 21 are respectively coupled to two ends of the first electrode strip 21, the two signal transmission lines 3 coupled to the second electrode strip 22 are respectively coupled to two ends of the second electrode strip 22, a portion of the signal transmission lines 3 are arranged in a first layer in the non-touch wiring region 12, another portion of the signal transmission lines 3 are arranged in a second layer in the non-touch wiring region 12, and a first insulation layer 4 is provided between the signal transmission lines 3 of the first layer and the signal transmission lines 3 of the second layer. The first insulation layer 4 insulates the signal transmission lines 3 of the first layer from the signal transmission lines 3 of the second layer. Compared with a case where all the signal transmission lines 3 are arranged in a same layer in the non-touch wiring region 12, an area occupied by the signal transmission lines 3 in the non-touch wiring region 12 is significantly reduced in a case where the signal transmission lines 3 are arranged in two layers, thus the non-touch wiring region 12 becomes narrower, thereby the touch panel can have a narrow bezel. Moreover, a sheet resistance can be reduced by connecting each of the first electrode strips 21 to two signal transmission lines 3 and connecting each of the second electrode strips 22 to two signal transmission lines 3, thus the touch panel will have a better touch effect.

It should be noted that, in some implementations, the quantities of signal transmission lines 3 respectively arranged in the two layers are equal or unequal to each other, no matter they are equal or unequal to each other, the area occupied by the signal transmission lines 3 in the non-touch wiring region 12 can be reduced to a certain extent.

In the present embodiment, for some implementations, the first electrode strips 21 are driving electrodes for mutual-capacitive touching, and the second electrode strips 22 are sensing electrodes for mutual-capacitive touching, or, the first electrode strips 21 are sensing electrodes for mutual-capacitive touching, and the second electrode strips 22 are driving electrodes for mutual-capacitive touching. The signal transmission lines 3 coupled to the first electrode strips 21 apply a touch driving signal to the first electrode strips 21, and the signal transmission lines coupled to the second electrode strips 22 apply a touch sensing signal to the second electrode strips 22.

In the present embodiment, for some implementations, half of the signal transmission lines 3 coupled to the first electrode strips 21 and the second electrode strips 22 are arranged in the first layer, and another half of the signal transmission lines 3 coupled to the first electrode strips 21 and the second electrode strips 22 are arranged in the second layer, and orthographic projections of the signal transmission lines 3 of the first layer on the substrate 1 completely overlap with orthographic projections of the signal transmission lines 3 of the second layer on the substrate 1. In such arrangement, the width of the non-touch wiring region 12 can be reduced by half, thus the touch panel has a real narrow bezel.

In the present embodiment, the touch panel optionally includes a black matrix 5 provided in the non-touch wiring region 12, the signal transmission lines 3 of the second layer are arranged at a side of the signal transmission lines 3 of the first layer distal to the substrate 1, and the black matrix 5 is arranged at a side of the signal transmission lines 3 of the first layer proximal to the substrate 1. The black matrix 5 can shield the non-touch wiring region 12 of the touch panel, so that the signal transmission lines 3 are prevented from affecting displaying of a display panel corresponding to the touch panel.

In the present embodiment, each of the first electrode strips 21 optionally includes a plurality of first electrode tabs 211 and a plurality of first connection bars 212, and is formed by connecting the first electrode tabs 211 via the first connection bars 212, each of the second electrode strips 22 optionally includes a plurality of second electrode tabs 221 and a plurality of second connection bars 222, and is formed by connecting the second electrode tabs 221 via the second connection bars 222. The first electrode strips 21 and the second electrode tabs 221 are provided in a same layer, the second connection bars 222 are provided at a side of the first connection bars 212 distal to the substrate 1 and intersect with the first connection bars 212, and a second insulation layer 6 is interposed between the first connection bars 212 and the second connection bars 222. The second insulation layer 6 can insulate the first connection bars 212 from the second connection bars 222. In such arrangement, a mutual capacitive touch can be achieved by the first electrode strips 21 and the second electrode strips 22.

In the present embodiment, the touch panel optionally includes a non-touch connection region 13, the signal transmission lines 3 of the first layer and the signal transmission lines 3 of the second layer further extend to the non-touch connection region 13 to connect to a peripheral circuit board in the non-touch connection region 13, the signal transmission lines 3 of the first layer and the signal transmission lines 3 of the second layer are provided in a same layer in the non-touch connection region 13, the black matrix 5 further extends to the non-touch connection region 13, and an orthographic projection of the black matrix 5 on the substrate 1 covers the non-touch connection region 13. Due to a requirement of connection, the signal transmission lines 3 of the first layer and the signal transmission lines 3 of the second layer are provided in a same layer in the non-touch connection region 13, so as to facilitate connections between the signal transmission lines 13 and the peripheral circuit board (e.g., a touch driving chip).

In the present embodiment, the touch panel optionally includes an insulation protection layer 7 provided at a side of the touch electrode 2 and the signal transmission lines 3 distal to the substrate 1, and an orthographic projection of the insulation protection layer 7 on the substrate 1 covers the touch region 11 and the non-touch wiring region 12. The insulation protection layer 7 can protect the touch electrode 2 and the signal transmission lines 3 on the substrate 1 from being damaged by external objects.

Based on the structure of the touch panel in accordance with the present embodiment, the present embodiment further provides a method for manufacturing the touch panel, as shown in FIGS. 3-16, the method includes steps of: forming a pattern of the touch electrode 2 in the touch region 11 of the substrate 1 by a patterning process; forming a pattern of at least two layers of signal transmission lines 3 that are overlapped with each other in the non-touch wiring region 12 of the substrate 1 by a patterning process, the signal transmission lines 3 of adjacent layers are insulated from each other, and the signal transmission lines 3 are coupled to the touch electrode 2 for transmitting a touch signal.

In the present embodiment, the step of forming the pattern of at least two layers of signal transmission lines 3 that are overlapped with each other in the non-touch wiring region 12 of the substrate 1 by the patterning process optionally includes sub-steps S10 through S12.

Figure 5:
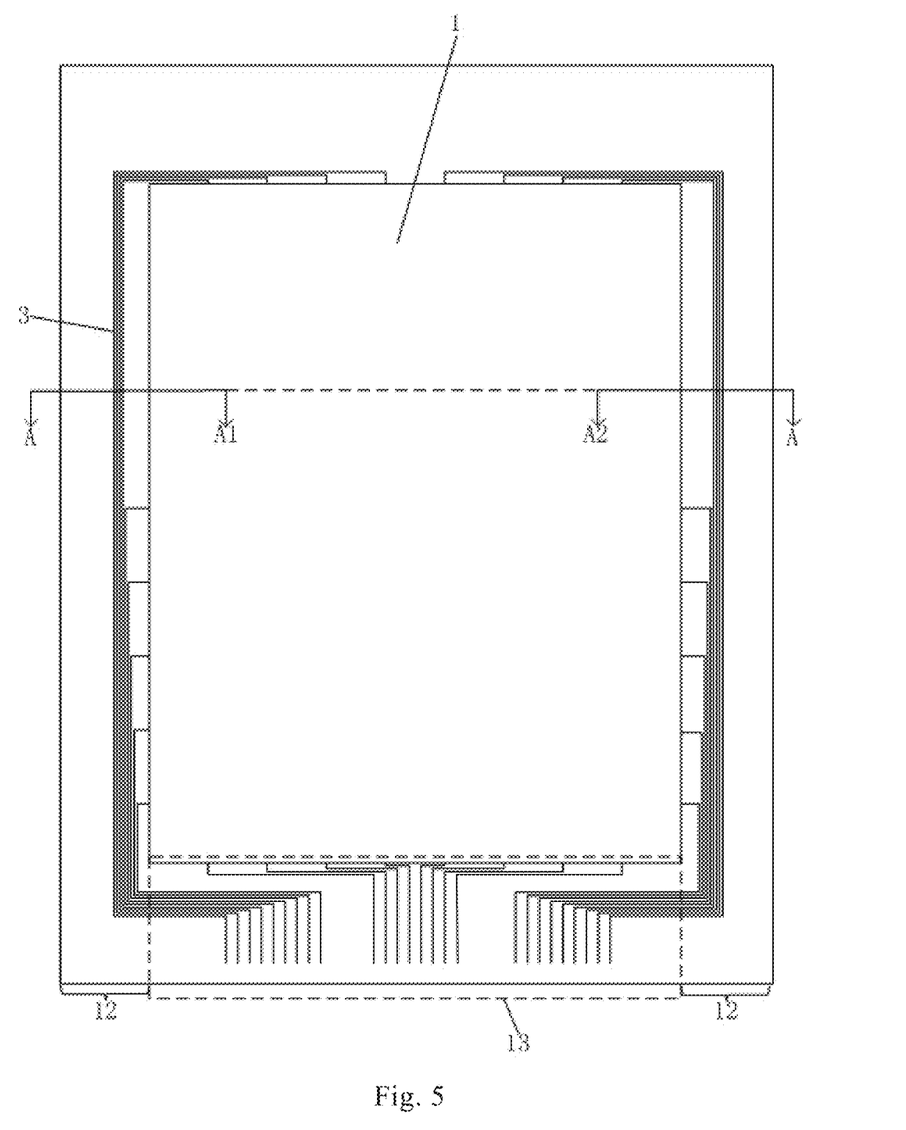
FIG. 5 shows a top view of a pattern of signal transmission line coupled to a first electrode strip in the touch panel in accordance with the first embodiment of the present disclosure.
Figure 6:
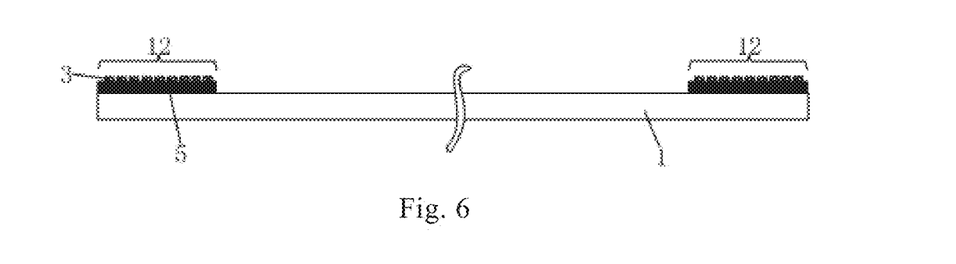
FIG. 6 shows a cross-sectional view of the structure of the touch panel shown in FIG. 5 along the cutting line A-A1-A2-A.

S10, forming a film for the signal transmission lines 3 of the first layer, forming a pattern of the signal transmission lines 3 of the first layer in the non-touch wiring region 12 by a single patterning process (as shown in FIGS. 5 and 6).

In the present embodiment, the film for the signal transmission lines of the first layer includes a material of metal, and the patterning process in the sub-step S10 optionally includes processes such as coating photoresist, exposing, developing, etching (wet etching) and stripping off photoresist etc., which will not be described in detail.

In some implementations, the sub-step S10 includes: forming a pattern of the signal transmission lines 3 of the first layer in the non-touch connection region 13, and the signal transmission lines 3 of the first layer in the non-touch connection region 13 and the signal transmission lines 3 of the first layer in the non-touch wiring region 12 are formed simultaneously by a single patterning process.

Figure 7:
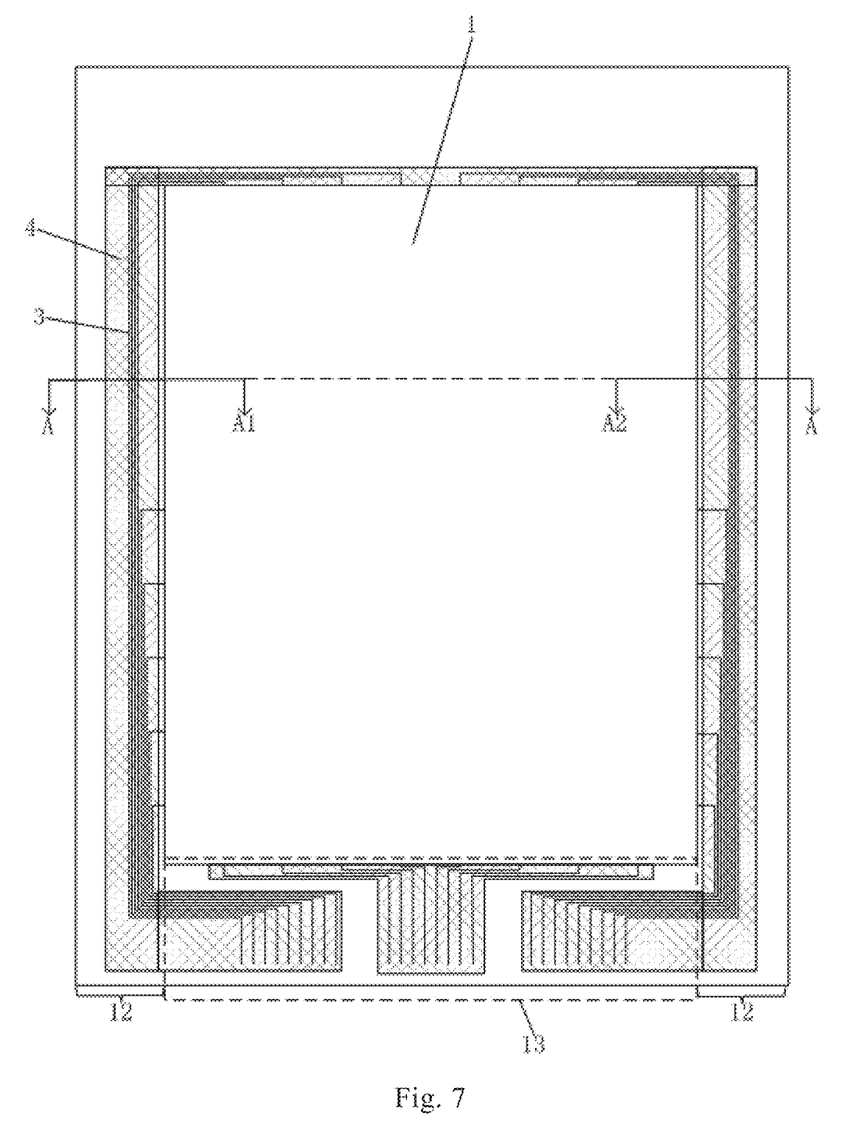
FIG. 7 shows a top view of a pattern of first insulation layer in the touch panel in accordance with the first embodiment of the present disclosure.
Figure 8:
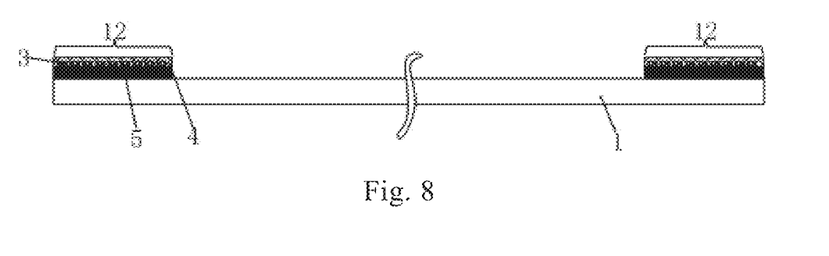
FIG. 8 shows a cross-sectional view of the structure of the touch panel shown in FIG. 7 along the cutting line A-A1-A2-A.

S11, after completing the sub-step S10, forming a pattern of the first insulation layer 4 in the non-touch wiring region 12 by a single processing process (as shown in FIGS. 7 and 8).

In the present embodiment, the first insulation layer 4 includes an inorganic insulation material, such as silicon nitride ($SiN_x$), and the patterning process in the sub-step S11 optionally includes processes such as film forming (e.g., coating film), exposing, developing and etching (dry etching) etc., which will not be described in detail.

It should be noted that, the first insulation layer 4 optionally also includes an organic insulation material, such as optical clear (OC) material.

In some implementations, the sub-step S11 includes: forming the first insulation layer 4 on the signal transmission lines 3 of the first layer in the non-touch connection region 13 rather than on other parts except for the signal transmission lines 3 of the first layer in the non-touch connection region 13, so that the signal transmission lines 3 of the first layer and the second layer in the non-touch connection region 13 are subsequently in a same layer.

Figure 13:
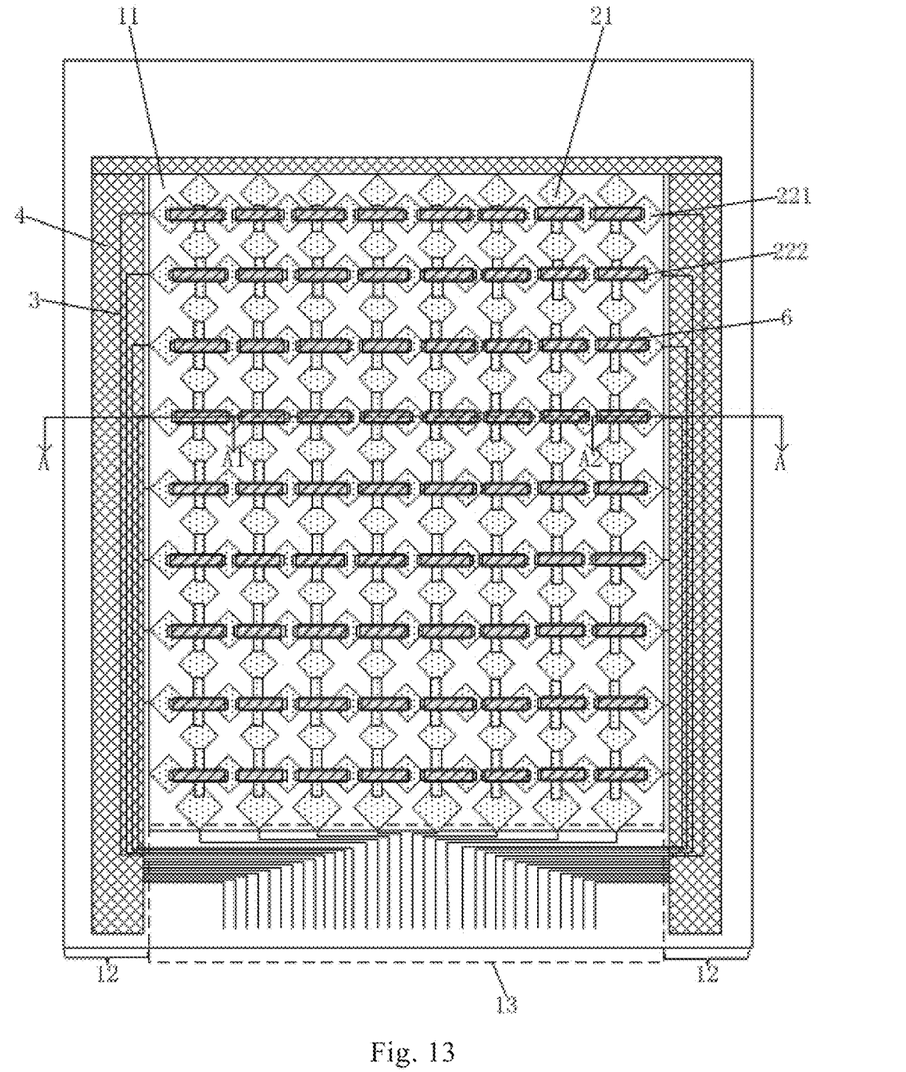
FIG. 13 shows a top view of a pattern of second connection bar and a pattern of signal transmission line coupled to a second electrode strip in the touch panel in accordance with the first embodiment of the present disclosure.
Figure 14:
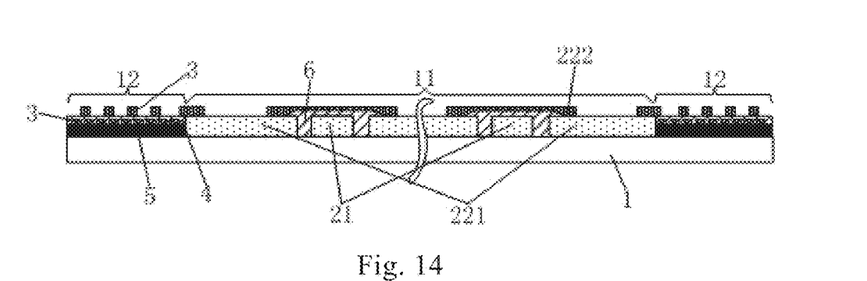
FIG. 14 shows a cross-sectional view of the structure of the touch panel shown in FIG. 13 along the cutting line A-A1-A2-A.

S12, after completing the sub-step S11, forming a pattern of the signal transmission lines 3 of the second layer in the non-touch wiring region 12 by a single patterning process (as shown in FIGS. 13 and 14).

In the sub-step S12, for some implementations, the material and the patterning process for the signal transmission lines 3 of the second layer are the same as those for the signal transmission lines 3 of the first layer, thus will not be described in detail here.

In some implementations, the sub-step S12 includes: forming a pattern of the signal transmission lines 3 of the second layer on other parts except for the signal transmission lines 3 of the first layer in the non-touch connection region 13, and the signal transmission lines 3 of the second layer in the non-touch connection region 13 and the signal transmission lines 3 of the second layer in the non-touch wiring region 12 are formed simultaneously by a single patterning process.

In some implementations, the method includes: after the sub-step S12, removing the first insulation layer 4 on the signal transmission lines 3 of the first layer in the non-touch connection region 13.

By the sub-steps S10 through S12, the signal transmission lines 3 are formed in a same layer in the non-touch connection region 13.

Figure 3:
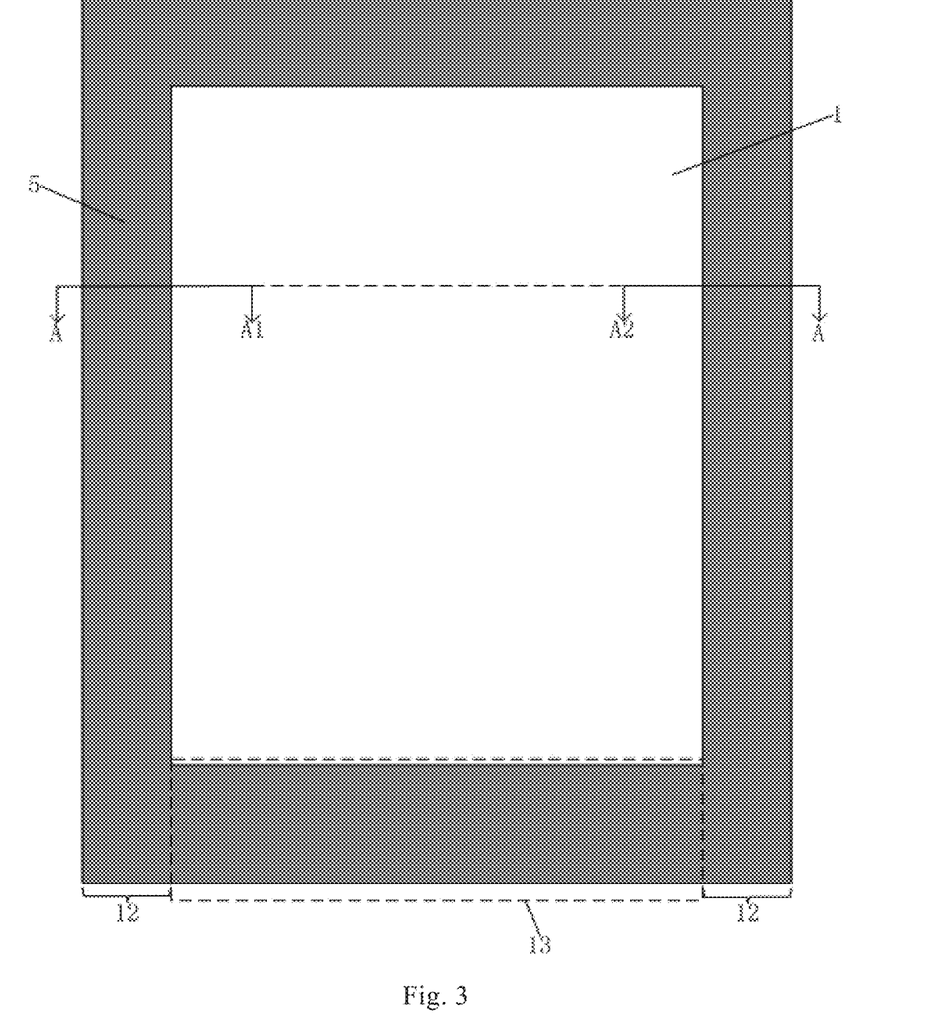
FIG. 3 shows a top view of a pattern of black matrix in the touch panel in accordance with the first embodiment of the present disclosure.
Figure 4:
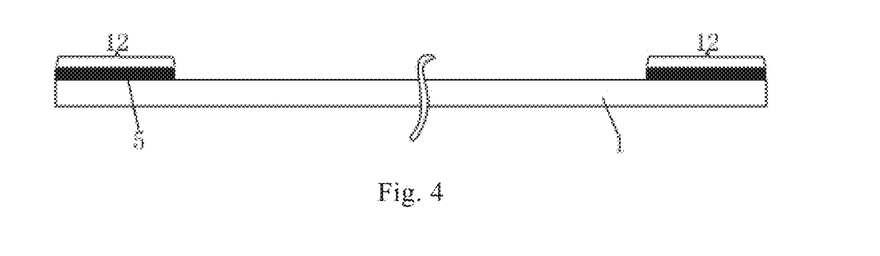
FIG. 4 shows a cross-sectional view of the structure of the touch panel shown in FIG. 3 along the cutting line A-A1-A2-A.

In the present embodiment, the method optionally includes: before the sub-step S10, forming a pattern of the black matrix 5 in the non-touch wiring region 12 by a patterning process (as shown in FIGS. 3 and 4). The patterning process optionally includes processes such as film forming, exposing and developing, which will not be described in detail here.

In some implementations, the method includes: before the sub-step S10, forming a pattern of the black matrix 5 in the non-touch connection region 13, and the black matrix 5 in the non-touch connection region 13 and the black matrix 5 in the non-touch wiring region 12 are formed simultaneously by a single pattern process.

In the present embodiment, the step of forming the pattern of the touch electrode 2 in the touch region 11 of the substrate 1 by the patterning process optionally includes sub-steps S20 through S22.

Figure 9:
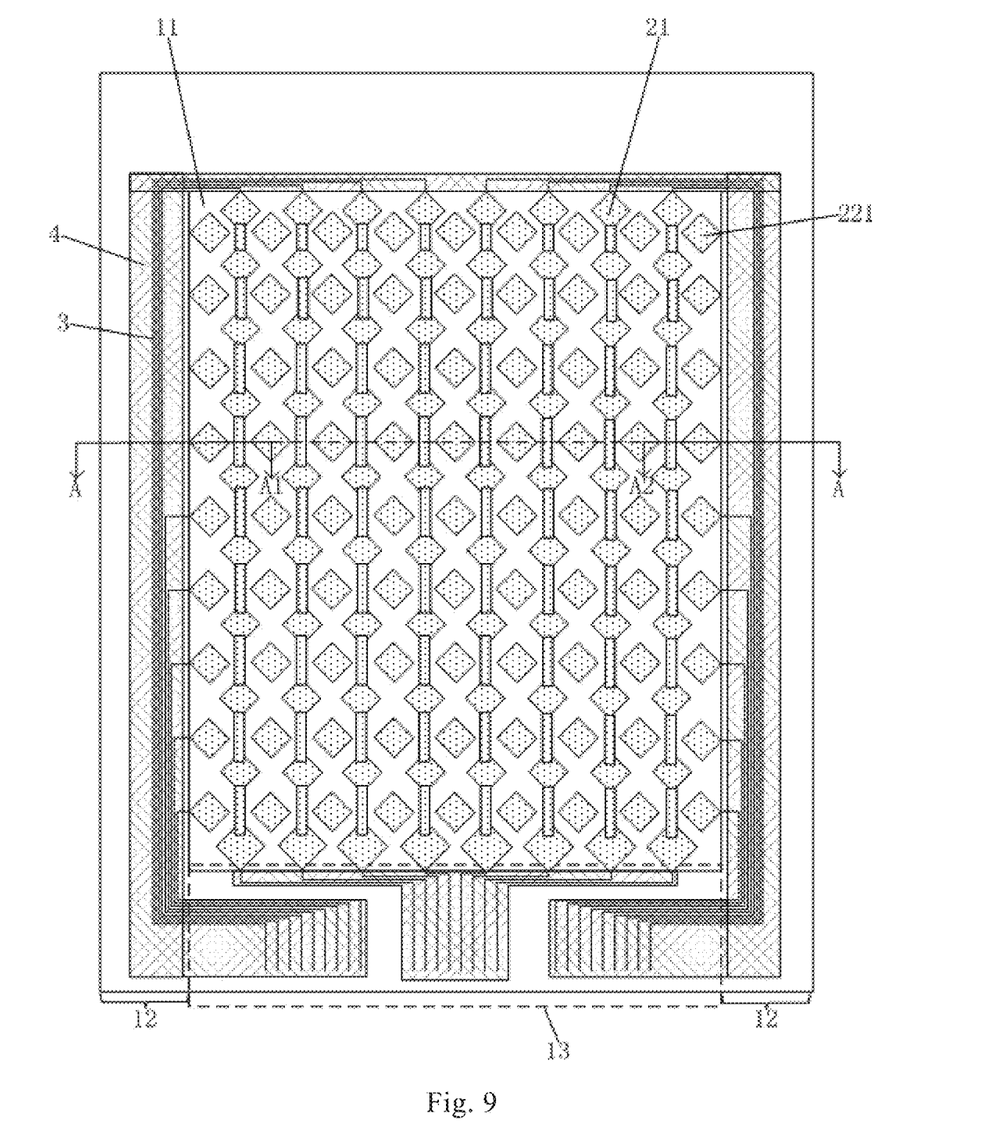
FIG. 9 shows a top view of a pattern of first electrode strip and second electrode tab in the touch panel in accordance with the first embodiment of the present disclosure.
Figure 10:
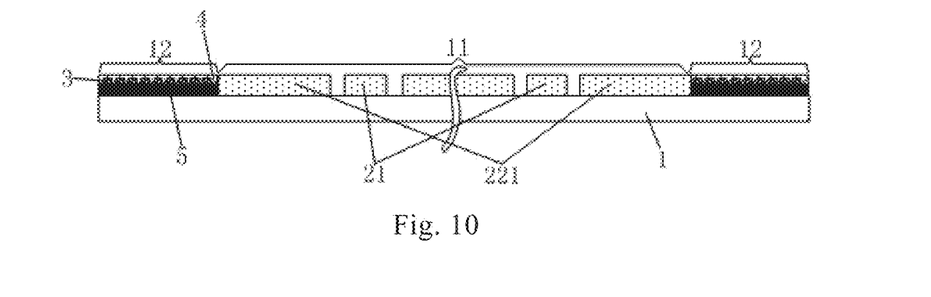
FIG. 10 shows a cross-sectional view of the structure of the touch panel shown in FIG. 9 along the cutting line A-A1-A2-A.

S20, forming a pattern of the first electrode strips 21 and the second electrode tabs 221 in the touch region 11 by a single patterning process (as shown in FIGS. 9 and 10).

In the present embodiment, the first electrode strips 21 and the second electrode tabs 221 include a transparent conductive material, such as indium tin oxide (ITO). The patterning process in the sub-step S20 optionally includes processes such as film forming, exposing, developing and etching (wet etching), which will not be described in detail.

Figure 11:
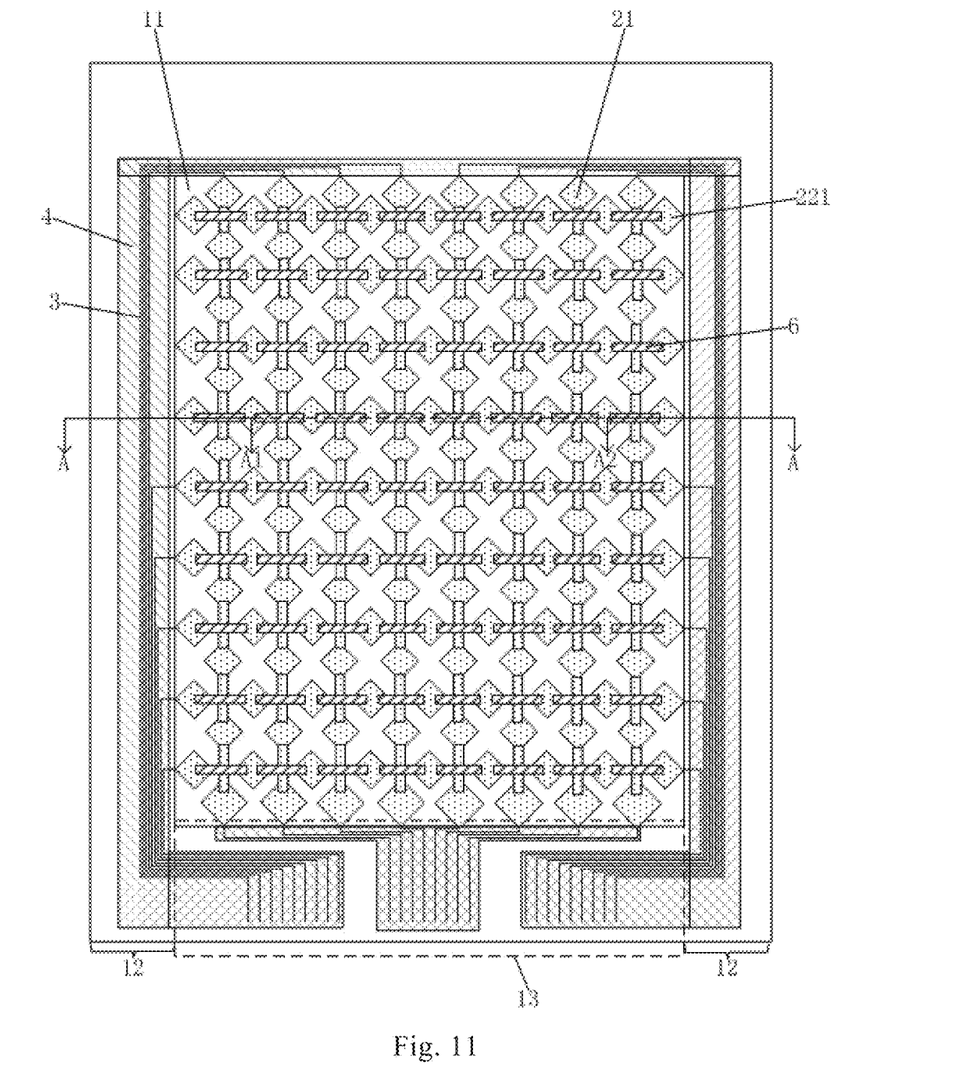
FIG. 11 shows a top view of a pattern of second insulation layer in the touch panel in accordance with the first embodiment of the present disclosure.
Figure 12:
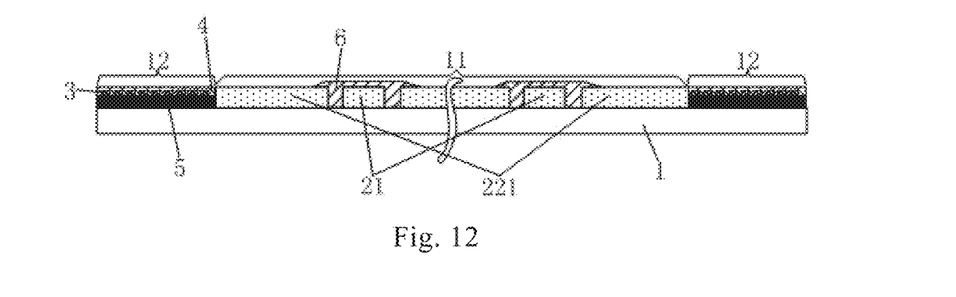
FIG. 12 shows a cross-sectional view of the structure of the touch panel shown in FIG. 11 along the cutting line A-A1-A2-A.

S21, after completing the sub-step S20, forming a pattern of the second insulation layer 6 in the touch region 11 by a single patterning process (as shown in FIGS. 11 and 12).

In the present embodiment, the second insulation layer 6 optionally includes an insulation nonopaque material, such as photoresist. The second insulation layer 6 can be insulative and nonopaque by using a material of photoresist. The patterning process in the sub-step S21 optionally includes processes such as film forming, exposing and developing, which will not be described in detail.

S22, after completing the sub-step S21, forming a pattern of the second connection bars 222 in the touch region 11 by a single patterning process (as shown in FIGS. 13 and 14).

For example, in some implementations, the second connection bars 222 and the signal transmission lines 3 of the second layer are formed of a same material (e.g., a material of metal) simultaneously by a single patterning process, which can reduce processes of patterning by one. Meanwhile, since the second connection bars 222 formed of a material of metal occupy very small area, the normal display of the display panel corresponding to the touch panel will not be affected.

Figure 15:
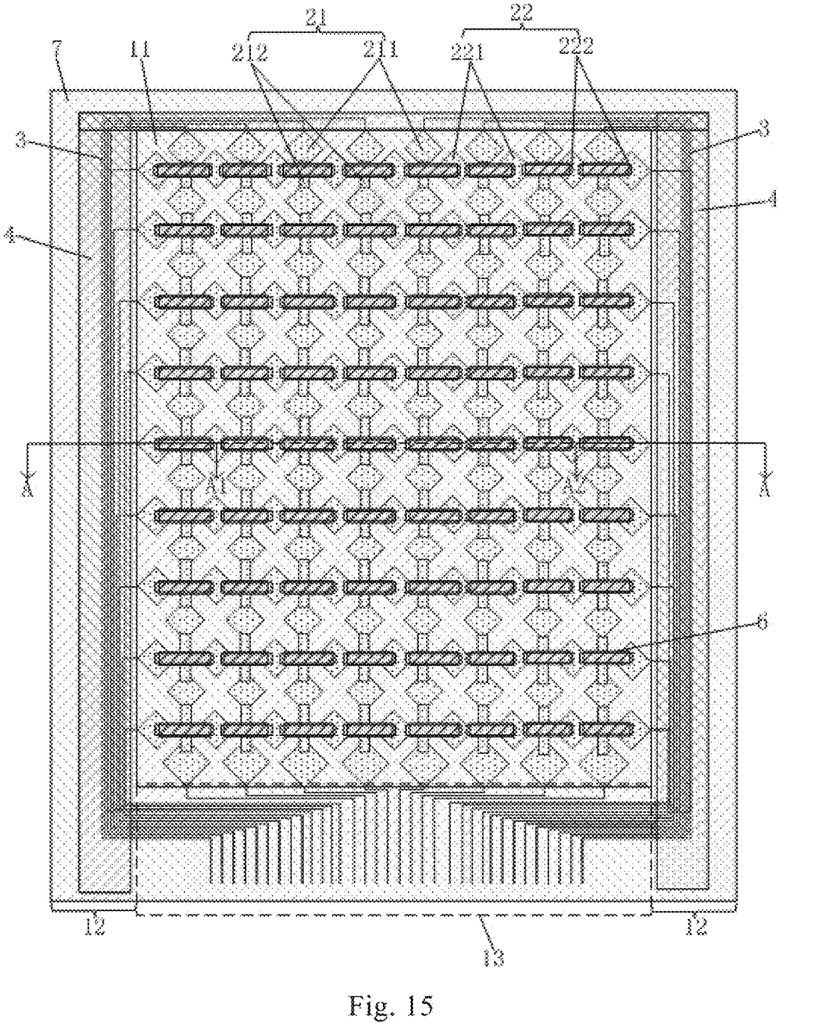
FIG. 15 shows a top view of a pattern of insulation protection layer in the touch panel in accordance with the first embodiment of the present disclosure.
Figure 16:
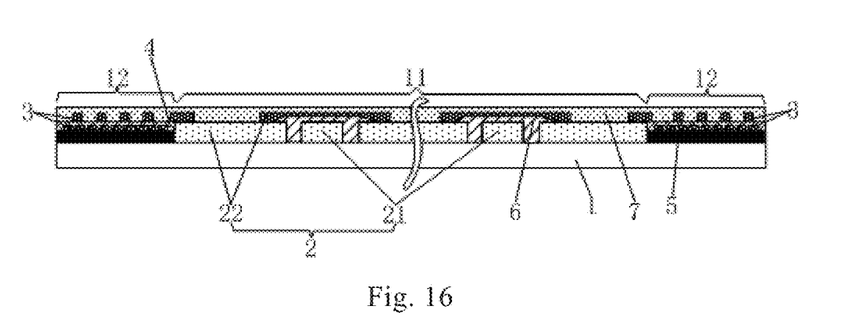
FIG. 16 shows a cross-sectional view of the structure of the touch panel shown in FIG. 15 along the cutting line A-A1-A2-A.

In the present embodiment, the method optionally includes: after forming the pattern of the touch electrode 2 in the touch region 11 and forming the pattern of at least two layers of signal transmission lines 3 that are overlapped with each other in the non-touch wiring region 12, forming a pattern of the insulation protection layer 7 by a single patterning process (as shown in FIGS. 15 and 16). The patterning process optionally includes processes such as film forming, exposing, developing and etching (dry etching), which will not be described in detail here.

In the present embodiment, the insulation protection layer 7 optionally includes an inorganic insulation material, such as silicon nitride or silicon oxynitride. The orthographic projection of the insulation protection layer 7 on the substrate 1 covers the touch region 11 and the non-touch wiring region 12.

It should be noted that, the patterning processes in the present embodiment optionally include printing, evaporating or the like, as long as the pattern required can be formed finally.

Second Embodiment

Figure 17:
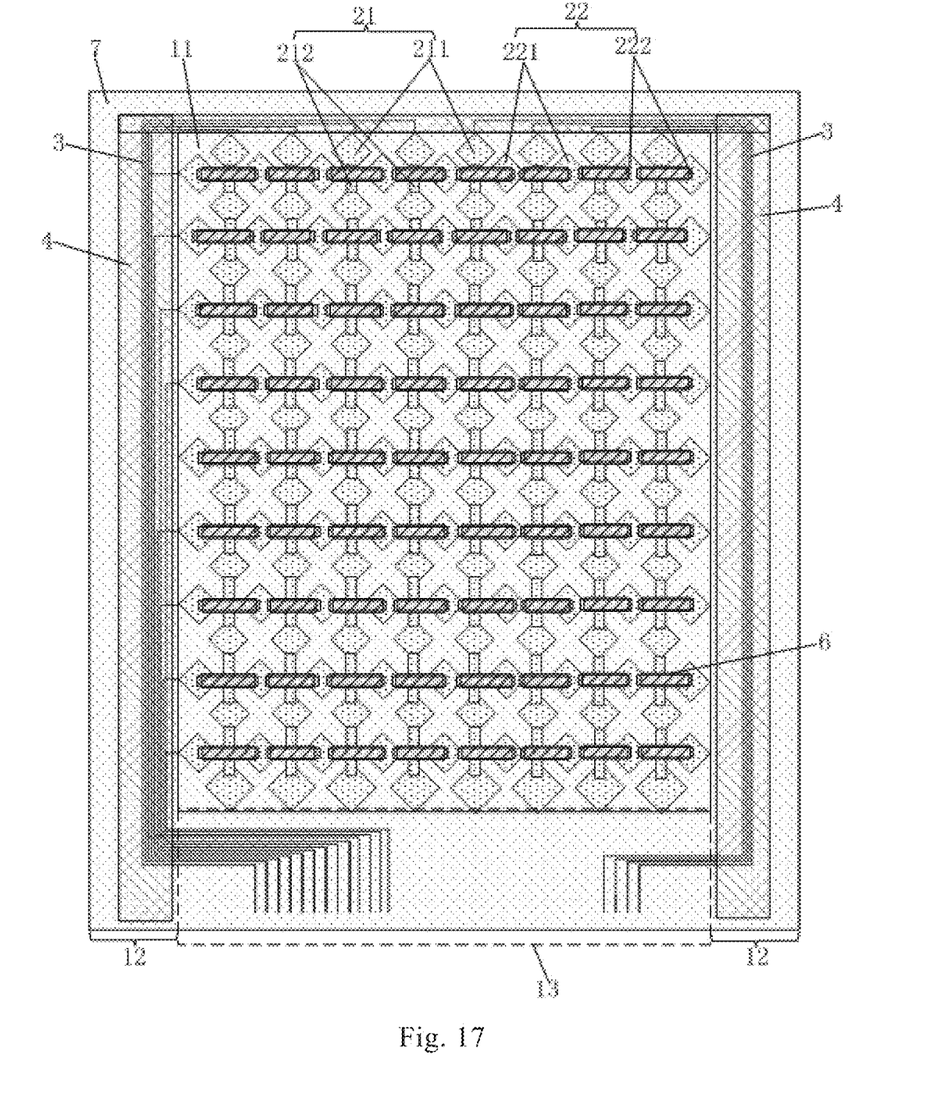
FIG. 17 shows a top view of a structure of a touch panel in accordance with a second embodiment of the present disclosure.

The present embodiment provides a touch panel, which is different from that of the first embodiment in that, as shown in FIG. 17, in the touch panel of the present embodiment, the signal transmission lines 3 are coupled to the first electrode strips 21 and the second electrode strips 22 one to one, that is to say, each of the first electrode strips 21 is coupled to one of the signal transmission lines 3, each of the second electrode strips 22 is coupled to one of the signal transmission lines 3, a portion of the signal transmission lines 3 are arranged in the first layer in the non-touch wiring region 12, another portion of the signal transmission lines 3 are arranged in the second layer in the non-touch wiring region 12, and the first insulation layer 4 is provided between the signal transmission lines 3 of the first layer and the signal transmission lines 3 of the second layer.

Other structures of the touch panel of the present embodiment are the same as those of the first embodiment, and will not be described in detail here.

Third Embodiment

The present embodiment provides a touch panel, structures of which are the same as those of the first or second embodiment, but the method for manufacturing the touch panel is different from those of the first and second embodiments in that, in the method of the present embodiment, the step of forming the pattern of the touch electrode in the touch region of the substrate by the patterning process includes sub-steps S20' through S22'.

S20', forming a pattern of the first electrode strips in the touch region by a single patterning process.

In the present embodiment, the first electrode strips include a transparent conductive material, such as indium tin oxide (ITO). The patterning process in the sub-step S20' optionally includes processes such as film forming, exposing, developing and etching (wet etching), which will not be described in detail.

S21', after completing the sub-step S20', forming a pattern of the second insulation layer in the touch region by a single patterning process.

In the present embodiment, the second insulation layer optionally includes an insulation nonopaque material, such as photoresist. The second insulation layer can be insulative and nonopaque by using a material of photoresist. The patterning process in the sub-step S21' optionally includes processes such as film forming, exposing and developing, which will not be described in detail.

S22', after completing the sub-step S21, forming a pattern of the second electrode strips in the touch region by a single patterning process.

In the present embodiment, the second electrode strips optionally includes a transparent conductive material, such as indium tin oxide (ITO). The patterning process in the sub-step S22' optionally includes processes such as film forming, exposing, developing and etching (wet etching), which will not be described in detail.

Other steps of the method for manufacturing the touch panel of the present embodiment are the same as those of the first embodiment, and will not be described in detail here.

In the present embodiment, the second electrode strips (including the second electrode tabs and the second connection bars) in the touch region of the touch panel are formed by a single patterning process.

Advantages of the first through third embodiments are as follows.

In the touch panels of the first through third embodiments, the signal transmission lines in the non-touch wiring region are arranged in at least two layers that are overlapped with each other, which can reduce the area occupied by the signal transmission lines in the non-touch wiring region, thus the non-touch wiring region of the touch panel becomes narrower, thereby the touch panel has a real narrow bezel.

Fourth Embodiment

The present embodiment provides a display apparatus including the touch panel of any of the first through third embodiments.

By employing the touch panel of any of the first through third embodiments, the display apparatus has a touch function and a narrower bezel, thereby the display apparatus has a real narrow bezel.

In some implementations, the display apparatus of the present embodiment is any product or member with a display function, such as liquid crystal panel, liquid crystal television, OLED panel, OLED television, display, mobile phone, navigator and so on.

It should be understood that, the above embodiments are merely exemplary embodiments for explaining principle of the present invention, but the present invention is not limited thereto. Various modifications and improvements can be made by those ordinary skilled in the art within the spirit and essence of the present invention, these modifications and improvements fall into the protection scope of the present invention.

The invention claimed is:

1. A touch panel, comprising a substrate, a touch electrode provided in a touch region of the substrate, and a plurality of signal transmission lines provided in a non-touch wiring region of the substrate, the non-touch wiring region of the substrate is located in a bezel of the touch panel, the signal transmission lines are coupled to the touch electrode for transmitting a touch signal, the signal transmission lines in the non-touch wiring region are arranged in at least two layers overlapping with each other, and the signal transmission lines of adjacent layers are insulated from each other, wherein the touch panel further comprises a non-touch connection region, the signal transmission lines of the first layer and the signal transmission lines of the second layer further extend to the non-touch connection region to connect to a peripheral circuit board in the non-touch connection region, the signal transmission lines of the first layer and the signal transmission lines of the second layer are provided in a same layer in the non-touch connection region, wherein the touch electrode comprises a plurality of first electrode strips and a plurality of second electrode strips, the first electrode strips intersect with and are insulated from the second electrode strips, each of the first electrode strips comprises a plurality of first electrode tabs and a plurality of first connection bars, and is formed by connecting the first electrode tabs via the first connection bars, each of the second electrode strips comprises a plurality of second electrode tabs and a plurality of second connection bars, and is formed by connecting the second electrode tabs via the second connection bars, the first electrode strips and the second electrode tabs are provided in a same layer, the second connection bars are provided at a side of the first connection bars distal to the substrate and intersect with the first connection bars, a second insulation layer is interposed between the first connection bars and the second connection bars, and the second connection bars and the signal transmission lines of the second layer are formed of a same material in a same layer.

2. The touch panel of claim 1, wherein the signal transmission lines are coupled to the first electrode strips and the second electrode strips one to one, a portion of the signal transmission lines are arranged in a first layer in the non-touch wiring region, another portion of the signal transmission lines are arranged in a second layer in the non-touch wiring region, and a first insulation layer is interposed between the signal transmission lines of the first layer and the signal transmission lines of the second layer.

3. The touch panel of claim 1, wherein each of the first electrode strips is coupled to two of the signal transmission lines, each of the second electrode strips is coupled to two of the signal transmission lines, the two of the signal transmission lines coupled to each of the first electrode strips are respectively coupled to two ends of each of the first electrode strips, the two of the signal transmission lines coupled to each of the second electrode strips are respectively coupled to two ends of each of the second electrode strips, a portion of the signal transmission lines are arranged in a first layer in the non-touch wiring region, another portion of the signal transmission lines are arranged in a second layer in the non-touch wiring region, and a first insulation layer is interposed between the signal transmission lines of the first layer and the signal transmission lines of the second layer.

4. The touch panel of claim 2, wherein half of the signal transmission lines coupled to the first electrode strips and the second electrode strips are arranged in the first layer, and another half of the signal transmission lines coupled to the first electrode strips and the second electrode strips are arranged in the second layer, and orthographic projections of the signal transmission lines of the first layer on the substrate completely overlap with orthographic projections of the signal transmission lines of the second layer on the substrate.

5. The touch panel of claim 2, further comprising a black matrix provided in the non-touch wiring region, the signal transmission lines of the second layer are arranged at a side of the signal transmission lines of the first layer distal to the substrate, and the black matrix is arranged at a side of the signal transmission lines of the first layer proximal to the substrate.

6. The touch panel of claim 5, wherein the black matrix further extends to the non-touch connection region, and an orthographic projection of the black matrix on the substrate covers the non-touch connection region.

7. The touch panel of claim 1, further comprising an insulation protection layer provided at a side of the touch electrode and the signal transmission lines distal to the substrate, and an orthographic projection of the insulation protection layer on the substrate covers the touch region and the non-touch wiring region.

8. A display apparatus, comprising the touch panel of claim 1.

9. A method for manufacturing the touch panel of claim 1, comprising steps of:

forming a pattern of the touch electrode in the touch region of the substrate by a patterning process, the touch electrode comprises a plurality of first electrode strips and a plurality of second electrode strips, each of the first electrode strips comprises a plurality of first electrode tabs and a plurality of first connection bars, each of the second electrode strips comprises a plurality of second electrode tabs and a plurality of second connection bars;

forming a pattern of at least two layers of signal transmission lines that are overlapped with each other in the non-touch wiring region of the substrate by a patterning process, wherein the signal transmission lines of adjacent layers are insulated from each other, and the signal transmission lines are coupled to the touch electrode for transmitting a touch signal, wherein the step of forming the pattern of at least two layers of signal transmission lines that are overlapped with each other in the non-touch wiring region of the substrate by the patterning process comprises sub-steps:

S10, forming a pattern of the signal transmission lines of the first layer in the non-touch wiring region and a pattern of the signal transmission lines of the first layer in the non-touch connection region simultaneously by a single patterning process;

S11, after completing the sub-step S10, forming a pattern of a first insulation layer in the non-touch wiring region by a single processing process and forming a pattern of a first insulation layer on the signal transmission lines of the first layer in the non-touch connection region, rather than on other parts except for the signal transmission lines of the first layer in the non-touch connection region;

S12, after completing the sub-step S11, forming a pattern of the signal transmission lines of the second layer in the non-touch wiring region and a pattern of the signal transmission lines of the second layer on other parts except for the signal transmission lines of the first layer in the non-touch connection region simultaneously by a single patterning process, wherein the step of forming the pattern of the touch electrode in the touch region of the substrate by the patterning process comprises sub-steps:

S20, forming a pattern of the first electrode strips and the second electrode tabs in the touch region by a single patterning process;

S21, after completing the sub-step S20, forming a pattern of the second insulation layer in the touch region by a single patterning process;

S22, after completing the sub-step S21 forming a pattern of the second connection bars in the touch region by a single patterning process, and wherein the second connection bars and the signal transmission lines of the second layer are formed of a same material simultaneously in a same layer by a single patterning process.

10. The method of claim 9, further comprising: before the sub-step S10, forming a pattern of the black matrix in the non-touch wiring region by a patterning process.

11. The method of claim 9, further comprising: after the sub-step S12, removing the first insulation layer on the signal transmission lines of the first layer in the non-touch connection region.

12. The method of claim 10, further comprising: before the sub-step S10, forming a pattern of the black matrix in the non-touch connection region, and the black matrix in the non-touch connection region and the black matrix in the non-touch wiring region are formed simultaneously by a single pattern process.

13. The method of claim 9, further comprising: after forming the pattern of the touch electrode in the touch region and forming the pattern of at least two layers of signal transmission lines that are overlapped with each other in the non-touch wiring region, forming a pattern of the insulation protection layer by a single patterning process, wherein the orthographic projection of the insulation protection layer on the substrate covers the touch region and the non-touch wiring region.

* * * * *